(12) United States Patent
Ji et al.

(10) Patent No.: US 12,223,243 B1
(45) Date of Patent: Feb. 11, 2025

(54) PREDICTION METHOD FOR WATER QUALITY BIOTOXICITY BASED ON ARTIFICIAL INTELLIGENCE NEURAL NETWORK

(71) Applicant: Nanjing Institute of Environmental Sciences, Ministry of Ecology and Environment, Nanjing (CN)

(72) Inventors: Guixiang Ji, Nanjing (CN); Min Guo, Nanjing (CN); Jie Gu, Nanjing (CN); Mengyuan Liang, Nanjing (CN); Liguo Guo, Nanjing (CN)

(73) Assignee: Nanjing Institute of Environmental Sciences, Ministry of Ecology and Environment, Nanjing (CN)

( * ) Notice: Subject to any disclaimer, the term of this patent is extended or adjusted under 35 U.S.C. 154(b) by 0 days.

(21) Appl. No.: 18/820,276

(22) Filed: Aug. 30, 2024

(30) Foreign Application Priority Data

Sep. 4, 2023 (CN) .......................... 202311126957.6

(51) Int. Cl.
*G06F 30/27* (2020.01)

(52) U.S. Cl.
CPC .................................. *G06F 30/27* (2020.01)

(58) Field of Classification Search
CPC ...... G06N 7/01; G06N 3/088; G01N 33/1886; G06Q 50/02; G16Y 10/15; G06F 30/27
See application file for complete search history.

(56) References Cited

U.S. PATENT DOCUMENTS

| | | | |
|---|---|---|---|
| 12,130,798 B1 * | 10/2024 | Brahmadesam | G06F 3/065 |
| 2018/0181876 A1 * | 6/2018 | Zhuo | G01N 33/1886 |
| 2021/0097217 A1 * | 4/2021 | Liu | G06N 20/20 |
| 2022/0044767 A1 * | 2/2022 | Rong | G06F 18/29 |
| 2022/0343194 A1 * | 10/2022 | Louisell, III | G16Y 10/35 |
| 2023/0196060 A1 * | 6/2023 | Louisell, III | G01N 33/18 422/68.1 |
| 2023/0362141 A1 * | 11/2023 | Crabtree | H04L 63/0807 |
| 2024/0295539 A1 * | 9/2024 | Li | G01N 33/18 |

* cited by examiner

*Primary Examiner* — Nha T Nguyen

(57) ABSTRACT

A prediction method for water quality biotoxicity based on artificial intelligence neural network is provided, which relates to the field of water quality biotoxicity prediction technologies, and is used to solve a problem that water quality biotoxicity detection is limited to water quality organisms themselves. The prediction method uses a system including a water quality analysis unit configured to analyze simulated to-be-predicted waters to obtain variation values of water pollution, a fish analysis unit configured to analyze a fish situation of test fish to obtain fish abnormal values, a water quality determination unit configured to determine water quality of the simulated to-be-predicted waters to obtain an actual water quality level of the simulated to-be-predicted waters and send it to a data comparison unit, and the data comparison unit configured to compare data of water quality situation of the simulated to-be-predicted waters to obtain a prediction result of water quality biotoxicity.

3 Claims, 3 Drawing Sheets

```
┌─────────────────────────────────────────────────────────────────────┐
│ Simulating, by a water quality simulation unit, a plurality of simulated to-be-predicted │
│ waters, and putting a fixed number of test fish into the plurality of simulated to-be- │──── S100
│ predicted waters                                                    │
└─────────────────────────────────────────────────────────────────────┘
                                    ↓
┌─────────────────────────────────────────────────────────────────────┐
│ Collecting, by a water quality collection unit, water quality parameters of each of the │
│ plurality of simulated to-be-predicted waters, and sending, by the water quality │
│ collection unit, the water quality parameters of each of the plurality of simulated to-be- │
│ predicted waters to a water quality determination unit and a model construction unit; │──── S200
│ and collecting, by a fish collection unit, fish response parameters of the test fish in each │
│ of the plurality of simulated to-be-predicted waters, and sending, by the fish collection │
│ unit, the fish response parameters of the test fish in each of the plurality of simulated │
│ to-be-predicted waters to a fish analysis unit                      │
└─────────────────────────────────────────────────────────────────────┘
                                    ↓
┌─────────────────────────────────────────────────────────────────────┐
│ Analyzing, by a water quality analysis unit, a water quality situation in each of the │
│ plurality of simulated to-be-predicted waters to obtain a variation value of water │
│ pollution, and sending, by the water quality analysis unit, the variation value of water │
│ pollution to the water quality determination unit; and analyzing, by the fish analysis │──── S300
│ unit, a fish situation of the test fish in each of the plurality of simulated to-be-predicted │
│ waters to obtain a fish abnormal value, and sending, by the fish analysis unit, the fish │
│ abnormal value to the water quality determination unit              │
└─────────────────────────────────────────────────────────────────────┘
                                    ↓
┌─────────────────────────────────────────────────────────────────────┐
│ Determining, by the water quality determination unit, water quality of each of the │
│ plurality of simulated to-be-predicted waters to obtain an actual water quality level of │
│ each of the plurality of simulated to-be-predicted waters, and sending, by the water │──── S400
│ quality determination unit, the actual water quality level of each of the plurality of │
│ simulated to-be-predicted waters to a data comparison unit          │
└─────────────────────────────────────────────────────────────────────┘
                                    ↓
┌─────────────────────────────────────────────────────────────────────┐
│ Introducing the variation value of water pollution of each of the plurality of simulated │
│ to-be-predicted waters and the fish abnormal value of the test fish in each of the │
│ plurality of simulated to-be-predicted waters into a water quality prediction model to │
│ obtain a predicted water quality level of each of the plurality of simulated to-be- │──── S500
│ predicted waters, and sending the predicted water quality level of each of the plurality │
│ of simulated to-be-predicted waters to the data comparison unit     │
└─────────────────────────────────────────────────────────────────────┘
                                    ↓
┌─────────────────────────────────────────────────────────────────────┐
│ Comparing the actual water quality level of each of the plurality of simulated to-be- │
│ predicted waters with the predicted water quality level of each of the plurality of │──── S600
│ simulated to-be-predicted waters to generate a signal indicating false prediction or a │
│ signal indicating correct prediction                                │
└─────────────────────────────────────────────────────────────────────┘
```

FIG. 1

PREDICTION METHOD FOR WATER QUALITY BIOTOXICITY BASED ON ARTIFICIAL INTELLIGENCE NEURAL NETWORK

CROSS-REFERENCE TO RELATED APPLICATION

This application claims priority to Chinese Patent Application No. 202311126957.6, filed on Sep. 4, 2023, which is herein incorporated by reference in its entirety.

TECHNICAL FIELD

The disclosure relates to the field of water quality biological detection technologies, and more particularly to a prediction method for water quality biotoxicity based on an artificial intelligence neural network.

BACKGROUND

An improvement of industrialization level has brought benefits to social and economic development, but it has also left serious environmental problems. Due to continuously increasing toxicity of pollutants discharged into water sources by high-pollution enterprises such as chemical companies, water quality toxicity detection is facing greater challenges. At the current stage, sensitivity of the water quality toxicity detection has been improved to a certain extent, but toxic effects of compounds are the comprehensive results of antagonistic or inhibitory effects of all components, thus a limitation of chemical substances alone cannot provide sufficient protection for safety of water bodies. Biological monitoring developed based on a principle of adaptation of organisms to the environment can more intuitively reflect changes in water quality. Commonly used organisms and their characteristic signals are mainly algae fluorescence intensity and luminescence intensity of luminescent bacteria, etc. However, this type of detection method not only has a long experimental cycle, many interference factors, and high cost, but also belongs to intermittent experiments, and accuracy is short in time.

Meanwhile, the water quality biotoxicity detection is limited to toxicity detection of the water quality organisms themselves, and no analysis and detection is performed on impact of the water quality biotoxicity on the environment.

To this end, a prediction method for water quality biotoxicity based on an artificial intelligence neural network is proposed.

SUMMARY

Aiming at disadvantages of the related art, a purpose of the disclosure is to provide a prediction method for water quality biotoxicity based on an artificial intelligence neural network.

A technical problem to be solved of the disclosure is how to achieve correct prediction of the water quality biotoxicity based on an impact of water quality organisms on water quality environment.

The purpose of the disclosure can be achieved through the following technical solutions.

A prediction method for water quality biotoxicity based on an artificial intelligence neural network, includes:

step S100, simulating, by a water quality simulation unit, multiple simulated to-be-predicted waters, and putting a fixed number of test fish into the multiple simulated to-be-predicted waters;

step S200, collecting, by a water quality collection unit, water quality parameters of each simulated to-be-predicted water, and sending, by the water quality collection unit, the water quality parameters of each simulated to-be-predicted water to a water quality determination unit and a model construction unit; and collecting, by a fish collection unit, fish response parameters of the test fish in each simulated to-be-predicted water, and sending, by the fish collection unit, the fish response parameters of the test fish in each simulated to-be-predicted water to a fish analysis unit;

step S300, analyzing, by a water quality analysis unit, a water quality situation in each simulated to-be-predicted water to obtain a variation value of water pollution, and sending, by the water quality analysis unit, the variation value of water pollution to the water quality determination unit; and analyzing, by the fish analysis unit, a fish situation of the test fish in each simulated to-be-predicted water to obtain a fish abnormal value, and sending, by the fish analysis unit, the fish abnormal value to the water quality determination unit;

step S400, determining, by the water quality determination unit, water quality of each simulated to-be-predicted water to obtain an actual water quality level of each simulated to-be-predicted water, and sending, by the water quality determination unit, the actual water quality level of each simulated to-be-predicted water to a data comparison unit;

step S500, introducing the variation value of water pollution of each simulated to-be-predicted water and the fish abnormal value of the test fish in each simulated to-be-predicted water into a water quality prediction model to obtain a predicted water quality level of each simulated to-be-predicted water, and sending the predicted water quality level of each simulated to-be-predicted water to the data comparison unit; and step S600, comparing, by the data comparison unit, the actual water quality level of each simulated to-be-predicted water with the predicted water quality level of each simulated to-be-predicted water to generate a signal indicating false prediction or a signal indicating correct prediction.

In an exemplary embodiment, the prediction method for water quality biotoxicity based on an artificial intelligence neural network further includes: applying, in response to generate the signal indicating correct prediction, the water quality prediction model to predict a water quality level of a to-be-predicted water, and formulating a pollution treatment plan of the to-be-predicted water according to the water quality level of the to-be-predicted water to perform pollution treatment. The pollution treatment plan includes: when the water quality level of the to-be-predicted water is an excellent water quality level or a good water quality level, performing no-operation; and when the water quality level of the to-be-predicted water is slightly polluted water quality level or a polluted water quality level, performing the sewage treatment on the to-be-predicted water.

In an exemplary embodiment, each of the water quality simulation unit, the fish collection unit, the water quality determination unit, the model construction unit, the fish analysis unit, the water quality analysis unit and the data comparison unit is embodied by software stored in at least one memory and executable by at least one processor.

In an embodiment, the water quality parameters include: initial water quality parameters and real-time water quality parameters. The initial water quality parameters include an initial dissolved oxygen content, an initial power of hydrogen (pH) value and an initial concentration of heavy metal ions in each simulated to-be-predicted water. The fish response parameters include: initial fish response parameters and real-time fish response parameters. The initial fish response parameters include an initial total survival of the test fish (also referred to as the total number of live test fish at the beginning). The real-time water quality parameters include a real-time dissolved oxygen content, a real-time pH value and a real-time concentration of heavy metal ions in each simulated to-be-predicted water. The real-time fish response parameters include a real-time total survival of the test fish (also referred to as the total number of live test fish in real time), a real-time abnormal total number of the test fish and a real-time total number of reproduction individuals of the test fish, and the real-time abnormal total number of the test fish is a number of test fish with growth retardation or limited reproduction.

In an embodiment, analysis steps of the water quality analysis unit include:
  obtaining the initial water quality parameters in each simulated to-be-predicted water to obtain the initial dissolved oxygen content, the initial pH value and the initial concentration of heavy metal ions in each simulated to-be-predicted water;
  obtaining the real-time water quality parameters in each simulated to-be-predicted water to obtain the real-time dissolved oxygen content, the real-time pH value and the real-time concentration of heavy metal ions in each simulated to-be-predicted water;
  calculating an initial water pollution value and a real-time water pollution value in each simulated to-be-predicted water based on the initial dissolved oxygen content, the initial pH value and the initial concentration of heavy metal ions in each simulated to-be-predicted water and the real-time dissolved oxygen content, the real-time pH value and the real-time concentration of heavy metal ions in each simulated to-be-predicted water;
  performing no-operation in response to the initial water pollution value being greater than or equal to the real-time water pollution value; and
  calculating, in response to the initial water pollution value being smaller than the real-time water pollution value, a difference between the real-time water pollution value and the initial water pollution value to obtain the variation value of water pollution of each simulated to-be-predicted water.

In an embodiment, the larger the variation value of water pollution, the more severely impact of the test fish on the multiple simulated to-be-predicted waters.

In an embodiment, analysis steps of the fish analysis unit include:
  obtaining the real-time fish response parameters of the test fish in each simulated to-be-predicted water to obtain the real-time total survival of the test fish, the real-time abnormal total number of the test fish and the real-time total number of reproduction individuals of the test fish in each simulated to-be-predicted water;
  obtaining the initial total survival of the test fish in each simulated to-be-predicted water;
  comparing the initial total survival of the test fish with the real-time total survival of the test fish;
  calculating, in response to the real-time total survival of the test fish being smaller than or equal to the initial total survival of the test fish, a fish death number of the test fish in each simulated to-be-predicted water by subtracting the real-time total survival of the test fish from the initial total survival of the test fish;
  calculating, in response to the real-time total survival of the test fish being greater than the initial total survival of the test fish, the fish death number of the test fish in each simulated to-be-predicted water by adding the initial total survival of the test fish to the real-time total number of reproduction individuals of the test fish and subtracting the real-time total survival of the test fish; and
  calculating the fish abnormal value of the test fish in each simulated to-be-predicted water based on the real-time abnormal total number of the test fish and the fish death number of the test fish.

In an embodiment, the larger the fish abnormal value, the more severely impact of the multiple simulated to-be-predicted waters on the test fish.

In an embodiment, a work process of the water quality determination unit include:
  obtaining the variation value of water pollution of each simulated to-be-predicted water;
  obtaining the fish abnormal value of the test fish in each simulated to-be-predicted water;
  calculating a water quality determination value of each simulated to-be-predicted water based on the variation value of water pollution and the fish abnormal value of the test fish; and
  comparing the water quality determination value of each simulated to-be-predicted water with a water quality determination threshold to determine the actual water quality level of each simulated to-be-predicted water.

In an embodiment, a data comparison process of the data comparison unit include:
  obtaining the predicted water quality level of each simulated to-be-predicted water output by the water quality prediction model;
  obtaining the actual water quality level of each simulated to-be-predicted water calculated by the water quality determination unit;
  comparing the actual water quality level of each simulated to-be-predicted water with a predicted water quality level of the simulated to-be-predicted water;
  counting, in response to the actual water quality level being equal to the predicted water quality level, a correctly predicted number once;
  obtaining a number of the multiple simulated to-be-predicted waters, recording the number of the multiple simulated to-be-predicted waters as a number of waters, and comparing the correctly predicted number with the number of waters to obtain prediction accuracy of the multiple simulated to-be-predicted waters;
  generating, in response to the prediction accuracy being smaller than preset prediction accuracy, a signal indicating false prediction; and
  generating, in response to the prediction accuracy being greater than or equal to the preset prediction accuracy, a signal indicating correct prediction.

Compared to the related art, beneficial effects of the disclosure are as follows.

Firstly, the disclosure analyzes the water quality situation in each simulated to-be-predicted water by the water quality analysis unit, to obtain the variation value of water pollution, and sends the variation value of water pollution to the water quality determination unit by the water quality analysis unit. Secondly, the disclosure analyzes the fish situation of the test fish in each simulated to-be-predicted water by the fish analysis unit to obtain the fish abnormal value, and sends the fish abnormal value to the water quality determination unit by the fish analysis unit. Finally, the disclosure determines the water quality of each simulated to-be-predicted water to obtain the actual water quality level of each simulated to-be-predicted water by the water quality determination unit, and sends the actual water quality level to the data comparison unit by the water quality determination unit. The variation value of water pollution of each simulated to-be-predicted water and the fish abnormal value of the test fish in each simulated to-be-predicted water are introduced into the water quality prediction model, to obtain the predicted water quality level of each simulated to-be-predicted water, and the predicted water quality level is sent to the data comparison unit. Finally, the data comparison unit is used to compare data of the water quality situation of each simulated to-be-predicted water, to generate the signal indicating false prediction or the signal indicating correct prediction. In the disclosure, the water quality situation and the fish situation of the test fish in the multiple simulated to-be-predicted waters are analyzed, to thereby achieve the correct prediction of the water quality biotoxicity.

BRIEF DESCRIPTION OF DRAWINGS

In order to facilitate understanding by those skilled in the art, the disclosure is further described below with reference to drawings.

FIG. 1 illustrates a flowchart of a prediction method for water quality biotoxicity based on an artificial intelligence neural network according to an embodiment of the disclosure.

DETAILED DESCRIPTION OF EMBODIMENTS

The technical solutions of the disclosure will be clearly and completely described below in conjunction with embodiments. Apparently, the described embodiments are merely some of the embodiments of the disclosure, not all of them. Based on the embodiments of the disclosure, all other embodiments obtained by those skilled in the art without creative work are within a scope of protection of the disclosure.

In an embodiment, as shown in FIG. 1, a prediction method for water quality biotoxicity based on an artificial intelligence neural network is provided, which is applied in a water, and the water can be a pond. In the embodiment, the water is a pond. Water quality organisms are put into the water to determine changes in the water, to thereby confirm the toxicity of the water quality organisms. Specifically, the prediction method includes the following steps S100-S600.

In step S100, a water quality simulation unit simulates multiple simulated to-be-predicted waters, and a fixed number of test fish is put into the multiple simulated to-be-predicted waters.

In step S200, a water quality collection unit collects water quality parameters of each simulated to-be-predicted water, and sends the water quality parameters to a water quality determination unit and a model construction unit. A fish collection unit collects fish response parameters of the test fish in each simulated to-be-predicted water, and sends the fish response parameters of the test fish to a fish analysis unit.

In step S300, a water quality analysis unit analyzes a water quality situation of each simulated to-be-predicted water to obtain a variation value of water pollution, and sends the variation value of water pollution to the water quality determination unit. The fish analysis unit analyzes a fish situation of the test fish in each simulated to-be-predicted water to obtain a fish abnormal value, and sends the fish abnormal value to the water quality determination unit.

In step S400, the water quality determination unit determines water quality of each simulated to-be-predicted water to obtain an actual water quality level of each simulated to-be-predicted water, and sends the actual water quality level to a data comparison unit.

In step S500, the variation value of water pollution of each simulated to-be-predicted water and the fish abnormal value of the test fish in each simulated to-be-predicted water are introduced into a water quality prediction model to obtain a predicted water quality level of each simulated to-be-predicted water, and the predicted water quality level is sent to the data comparison unit.

In step S600, the data comparison unit compares the actual water quality level of each simulated to-be-predicted water with the predicted water quality level of each simulated to-be-predicted water to generate a signal indicating false prediction or a signal indicating correct prediction.

Figure 2:
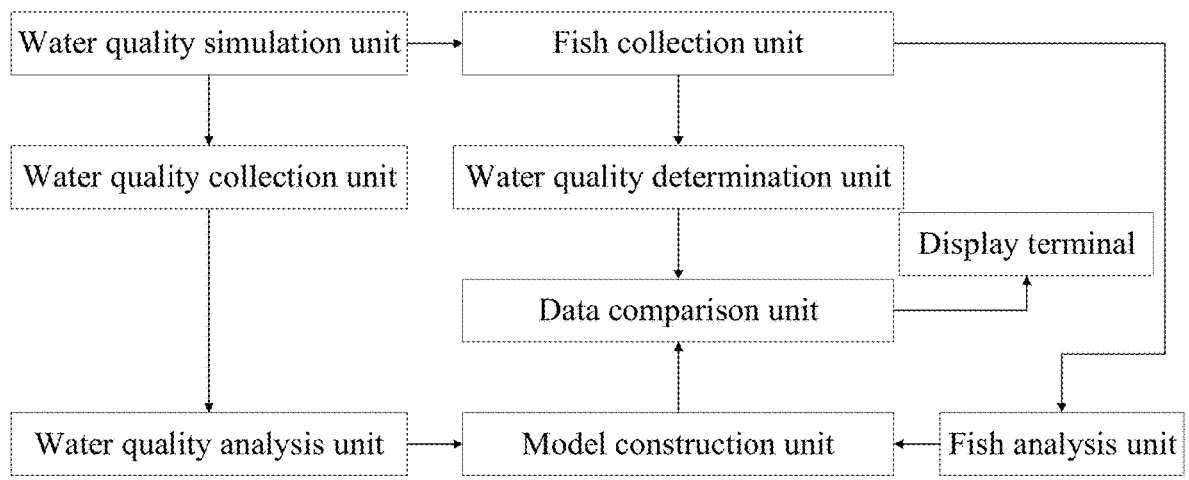
FIG. 2 illustrates a flowchart of a system involved in the prediction method for water quality biotoxicity based on the artificial intelligence neural network according to an embodiment of the disclosure.

In the embodiment, as shown in FIG. 2, the prediction method involves the water quality simulation unit, the water quality collection unit, the fish collection unit, the water quality analysis unit, the fish analysis unit, the water quality determination unit, the model construction unit, the data comparison unit and a display terminal.

The water quality simulation is configured to simulate multiple simulated to-be-predicted waters with same water quality parameters of a to-be predicted water, the simulated to-be-predicted waters are marked as n, n=1, 2, . . . , z, and z is a positive integer. Specifically, multiple groups of water samples for simulated culture are collected in the to-be predicted water, and the same simulated to-be-predicted waters can be also simulated in a laboratory according to the water quality parameters of the to-be predicted water. The water quality parameters include a dissolved oxygen content, a pH value and a concentration of heavy metal ions in each simulated to-be-predicted water.

It should be noted that in addition to ensuring that the water quality parameters in the simulated to-be-predicted waters are the same as those in the to-be-predicted water, it is also necessary to ensure that external environmental parameters such as light and temperature are the same.

After generating the simulated to-be-predicted waters, the water quality collection unit is configured to collect initial water quality parameters of the simulated to-be-predicted waters. The initial water quality parameters include an initial dissolved oxygen content, an initial pH value and an initial concentration of heavy metal ions in the simulated to-be-predicted water. Then the fixed number of the test fish are put into the simulated to-be-predicted waters. For universality, the test fish can be black carp, carp, crucian and the like. Before putting the test fish into the simulated to-be-predicted waters, the fish collection unit is configured to collect initial fish response parameters of the test fish. The initial fish response parameters include an initial total survival of the test fish.

After putting the test fish into the simulated to-be-predicted waters for a certain period of time, the water quality collection unit is further configured to collect real-time water quality parameters of each simulated to-be-predicted water, and send the real-time water quality parameters to the water quality determination unit and the model construction unit. The real-time water quality parameters include a real-time dissolved oxygen content, a real-time pH value and a real-time concentration of heavy metal ions of each simulated to-be-predicted water.

The fish collection unit is further configured to collect real-time fish response parameters of the test fish in each simulated to-be-predicted water, and send the real-time fish response parameters to the fish analysis unit. Specifically, the real-time fish response parameters include a real-time total survival of the test fish, a real-time abnormal total number of the test fish and a real-time total number of reproduction individuals of the test fish, and the real-time abnormal total number of the test fish is a number of test fish with obvious adverse reactions such as growth retardation and limited reproduction.

In a specific embodiment, the water quality collection unit can be at least one selected from the group consisting of a dissolved oxygen meter, a pH meter, a heavy metal meter and a water quality meter, which is not limited here.

It should be noted that the collections of the water quality parameters and the fish response parameters are performed simultaneously.

The water quality analysis unit is configured to analyze the water quality situation of each simulated to-be-predicted water, and the specific steps for analysis are as follows.

In step S1, the initial water quality parameters of each simulated to-be-predicted water are obtained to obtain the initial dissolved oxygen content $RYCn$, the initial pH value $PHCn$ and the initial concentration of heavy metal ions $ZLCn$ of each simulated to-be-predicted water. The real-time water quality parameters of each simulated to-be-predicted water are obtained to obtain the real-time dissolved oxygen content $RYSn$, the real-time pH value $pHSn$ and the real-time concentration of heavy metal ions $ZLSn$ of each simulated to-be-predicted water. Specifically, n represents a number of the simulated to-be-predicted waters.

In step S2, the initial dissolved oxygen content $RYCn$, the initial pH value $PHCn$ and the initial concentration of heavy metal ions $ZLCn$ are substituted into a formula $SWCn=[A1\times(pHCn-X)+A2\times ZLCn]/RYCn$ to obtain an initial water pollution value $SWCn$ of each simulated to-be-predicted water. In the formula, A1 and A2 each represent a proportional coefficient with a fixed value, and values of A1 and A2 are greater than 0. A value of X is determined by $pHCn$, when $pHCn$ is smaller than 6, X is 6.5, when $pHCn$ is greater than 9, X is 8.5, and X is 7 in other scenarios. The real-time dissolved oxygen content $RYSn$, the real-time pH value $pHSn$ and the real-time concentration of heavy metal ions $ZLSn$ are substituted into a formula $SWSn=[A1\times(pHSn-X)+A2\times ZLSn]/RYSn$ to obtain a real-time water pollution value of each simulated to-be-predicted water.

In step S3, a difference between the real-time water pollution value and the initial water pollution value of each simulated to-be-predicted water is calculated to obtain the variation value of water pollution of each simulated to-be-predicted water through a formula $SWBn=SWSn-SWCn$.

It should be noted that when $SWCn$ is greater than $SWSn$, this simulated to-be-predicted water does not participate in the calculation, nor does it participate in all subsequent steps.

Specifically, the larger the variation value of water pollution, the more severely impact of the test fish on the simulated to-be-predicted waters.

The water quality analysis unit is configured to send the variation value of water pollution of each simulated to-be-predicted water to the water quality determination unit and the model construction unit.

The fish analysis unit is configured to analyze the fish situation of the test fish in each simulated to-be-predicted water, and specific steps for analysis are as follows.

In step P1, the real-time fish response parameters of the test fish in each simulated to-be-predicted water are obtained. The real-time fish response parameters include the real-time total survival $YSCn$ of the test fish, the real-time abnormal total number $YYSn$ of the test fish and the real-time total number $YFSn$ of reproduction individuals of the test fish. The initial total survival $YCCn$ of the test fish in each simulated to-be-predicted water is obtained. The initial total survival $YCCn$ of the test fish is compared with the real-time total survival $YSCn$ of the test fish. In response to the real-time total survival $YSCn$ of the test fish being smaller than or equal to the initial total survival $YCCn$ of the test fish, a fish death number $YSn$ of the test fish in each simulated to-be-predicted water is calculated through a formula $YSn=YCCn-YCSn$. In response to the real-time total survival $YSCn$ of the test fish being greater than the initial total survival $YCCn$ of the test fish, the fish death number $YSn$ of the test fish in each simulated to-be-predicted water is calculated through a formula $YSn=YCCn+YFSn-YCSn$.

In step P2, the fish abnormal value $YZn$ of the test fish in each simulated to-be-predicted water is obtained through a formula $YZn=(B1\times YYSn+B2\times YSn)/YCCn$. In the formula, B1 and B2 each represent a proportional coefficient with a fixed value, and values of B1 and B2 are greater than 0.

Specifically, the larger the fish abnormal value, the more severely impact of the simulated to-be-predicted waters on the test fish in the simulated to-be-predicted waters.

The fish analysis unit is configured to send the fish abnormal value of the test fish in each simulated to-be-predicted water to the water quality determination unit and the model construction unit.

The water quality determination unit is configured to determine the water quality of each simulated to-be-predicted water, and a specific working process includes the following steps Q1-Q4.

In step Q1, the variation value of water pollution $SWBn$ of each simulated to-be-predicted water is obtained.

In step Q2, the fish abnormal value $YZn$ of the test fish in each simulated to-be-predicted water is obtained.

In step Q3, a water quality determination value of each simulated to-be-predicted water is calculated through a formula $DPn=C1\times SWBn+C2\times YZn$. In the formula, C1 and C2 each represent a proportional coefficient with a fixed value, and values of C1 and C2 are greater than 0.

In step Q4, the water quality determination value of each simulated to-be-predicted water is compared with a water quality determination threshold. In response to $DPn\leq X1$, the actual water quality level of the simulated to-be-predicted water is determined as excellent water quality. In response to $X1<DPn\leq X2$, the actual water quality level of the simulated to-be-predicted water is determined as good water quality. In response to $X2<DPn\leq X3$, the actual water quality level of the simulated to-be-predicted water is determined as slightly polluted water quality. In response to $X3<DPn$, the actual water quality level of the simulated to-be-predicted water is determined as polluted water quality. Specifically, 0<X1<X2<X3.

The water quality determination unit is configured to send the actual water quality level of each simulated to-be-predicted water to the data comparison unit.

The model construction unit is configured to construct the water quality prediction model of water quality organisms according to an artificial recurrent neural network (RNN), and a specific working process includes the following steps T1-T3.

In step T1, the initial water quality parameters and the real-time water quality parameters of each simulated to-be-predicted water and the initial fish response parameters and the real-time fish response parameters of the test fish in each simulated to-be-predicted water are obtained. It should be noted that the model construction unit is equipped with PyTorch™, and PyTorch™ is a popular deep learning framework, which provides tools for constructing and training the neural network.

In step T2, the model construction unit constructs an artificial RNN model (i.e., the water quality prediction model) by using PyTorch™, the initial water quality parameters and the real-time water quality parameters in each simulated to-be-predicted water and the initial fish response parameters and the real-time fish response parameters of the test fish in each simulated to-be-predicted water are input into the RNN model to obtain a predicted water quality level of each simulated to-be-predicted water, and the predicted water quality level is output by the RNN model.

Figure 3:
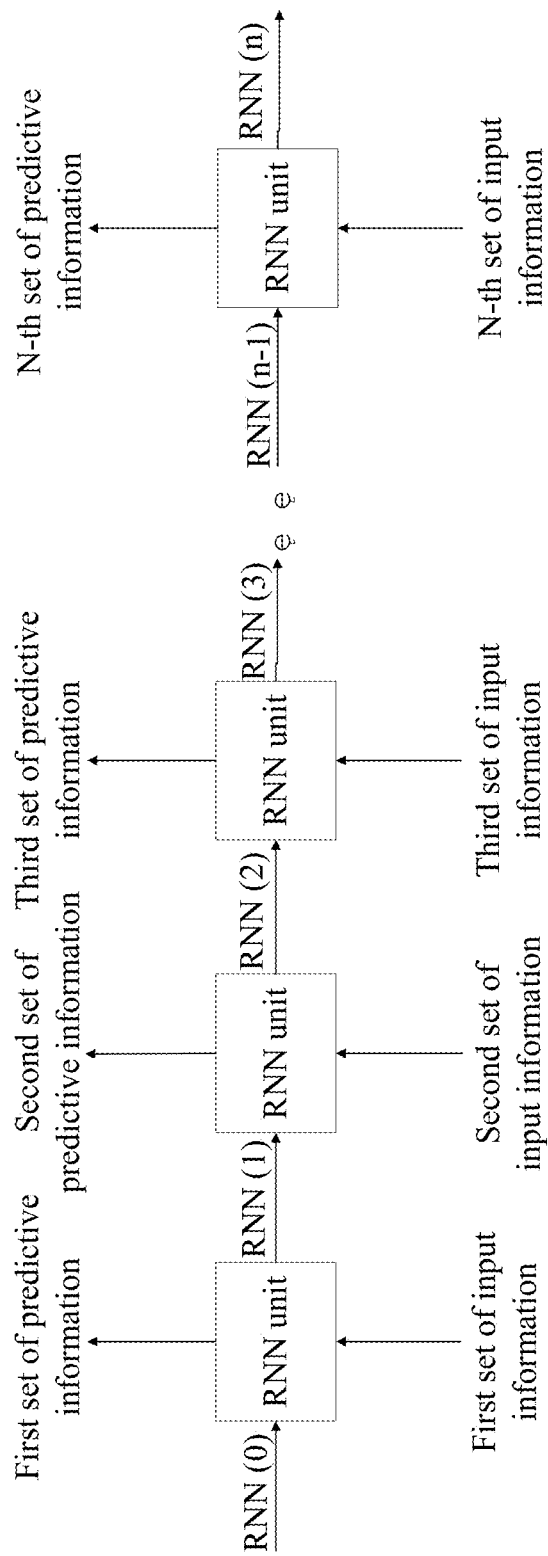
FIG. 3 illustrates a schematic diagram of a fully connected recurrent unit expanded by an artificial recurrent neural network (RNN) model (i.e., a water quality prediction model) according to an embodiment of the disclosure.

In step T3, learning and training are performed on the RNN model by a fully connected recurrent unit expanded by the RNN model as shown in FIG. 3. The fully connected recurrent unit is configured to output the predicted water quality level of each simulated to-be-predicted water to the data comparison unit.

The data comparison unit is configured to compare the actual water quality level of each simulated to-be-predicted water with the predicted water quality level of each simulated to-be-predicted water, and a process for data comparison is as follows.

The predicted water quality level of each simulated to-be-predicted water output by the water quality prediction model of the water quality organisms is obtained.

The actual water quality level of each simulated to-be-predicted water calculated by the water quality determination unit is obtained.

The actual water quality level of each simulated to-be-predicted water is compared with the predicted water quality level of the simulated to-be-predicted water.

A correctly predicted number is counted once in response to the actual water quality level being equal to the predicted water quality level. It should be noted that an initial value of the correctly predicted number is 0.

A number of the simulated to-be-predicted waters is obtained and recorded as a number of waters, the correctly predicted number is compared with the number of waters to obtain prediction accuracy. Specifically, the number of waters is a total number of the above simulated to-be-predicted waters involved in calculation.

The correctly predicted number is compared with the number of waters to obtain the prediction accuracy of the simulated to-be-predicted waters.

The signal indicating false prediction is generated in response to the prediction accuracy being smaller than preset prediction accuracy.

The signal indicating correct prediction is generated in response to the prediction accuracy being greater than or equal to the preset prediction accuracy.

The data comparison unit is configured to send the signal indicating false prediction or the signal indicating correct prediction to the display terminal. The display terminal is configured to display the predicted result of water quality biotoxicity of the simulated to-be-predicted waters. The predicted result of water quality biotoxicity is represented as the signal indicating false prediction or the signal indicating correct prediction.

In the disclosure, when there is a corresponding calculation formula, the above calculation formula is all dimensionless and take its numerical values for calculation. The weight coefficients, the proportional coefficients and other coefficients in the formula set to quantify each parameter to obtain a result value. The size of the weight coefficient and the proportional coefficient can be determined as long as it does not affect the proportional relationship between the parameter and the result value.

The embodiments of the disclosure disclosed above are merely used to help describe the disclosure. The embodiments do not describe all the details in detail, nor do they limit the specific implementation of the disclosure. Apparently, many amendments and changes can be made according to the content of this specification. The specification selects and specifically describes these embodiments in order to better describe principles and practical applications of the disclosure, so that those skilled in the art can understand and use the disclosure well. The disclosure is limited only by claims, as well as full scope and equivalents thereof.

What is claimed is:

1. A prediction method for water quality biotoxicity based on an artificial intelligence neural network, comprising:
    step S100, simulating, by a water quality simulation unit, a plurality of simulated to-be-predicted waters, and putting a fixed number of test fish into the plurality of simulated to-be-predicted waters;
    step S200, collecting, by a water quality collection unit, water quality parameters of each of the plurality of simulated to-be-predicted waters, and sending, by the water quality collection unit, the water quality parameters of each of the plurality of simulated to-be-predicted waters to a water quality determination unit and a model construction unit; and collecting, by a fish collection unit, fish response parameters of the test fish in each of the plurality of simulated to-be-predicted waters, and sending, by the fish collection unit, the fish response parameters of the test fish in each of the plurality of simulated to-be-predicted waters to a fish analysis unit;
        wherein the water quality parameters comprise: initial water quality parameters and real-time water quality parameters; the initial water quality parameters comprise an initial dissolved oxygen content, an initial power of hydrogen (pH) value and an initial concentration of heavy metal ions in each of the plurality of simulated to-be-predicted waters; and the real-time water quality parameters comprise a real-time dissolved oxygen content, a real-time pH value and a real-time concentration of heavy metal ions in each of the plurality of simulated to-be-predicted waters;
        wherein the fish response parameters comprise: initial fish response parameters and real-time fish response parameters; the initial fish response parameters comprise an initial total survival of the test fish; and the real-time fish response parameters comprise a real-time total survival of the test fish, a real-time abnormal total number of the test fish and a real-time total number of reproduction individuals of the test fish, and the real-time abnormal total number of the test fish is a number of test fish with growth retardation or limited reproduction;

step S300, analyzing, by a water quality analysis unit, a water quality situation in each of the plurality of simulated to-be-predicted waters to obtain a variation value of water pollution, and sending, by the water quality analysis unit, the variation value of water pollution to the water quality determination unit; and analyzing, by the fish analysis unit, a fish situation of the test fish in each of the plurality of simulated to-be-predicted waters to obtain a fish abnormal value, and sending, by the fish analysis unit, the fish abnormal value to the water quality determination unit;

wherein analysis steps of the water quality analysis unit comprise:

obtaining the initial water quality parameters in each of the plurality of simulated to-be-predicted waters to obtain the initial dissolved oxygen content, the initial pH value and the initial concentration of heavy metal ions in each of the plurality of simulated to-be-predicted waters;

obtaining the real-time water quality parameters in each of the plurality of simulated to-be-predicted waters to obtain the real-time dissolved oxygen content, the real-time pH value and the real-time concentration of heavy metal ions in each of the plurality of simulated to-be-predicted waters;

calculating an initial water pollution value and a real-time water pollution value in each of the plurality of simulated to-be-predicted waters based on the initial dissolved oxygen content, the initial pH value and the initial concentration of heavy metal ions in each of the plurality of simulated to-be-predicted waters and the real-time dissolved oxygen content, the real-time pH value and the real-time concentration of heavy metal ions in each of the plurality of simulated to-be-predicted waters;

performing no-operation in response to the initial water pollution value being greater than or equal to the real-time water pollution value; and calculating, in response to the initial water pollution value being smaller than the real-time water pollution value, a difference between the real-time water pollution value and the initial water pollution value to obtain the variation value of water pollution of each of the plurality of simulated to-be-predicted waters;

wherein analysis steps of the fish analysis unit comprise:

obtaining the real-time fish response parameters of the test fish in each of the plurality of simulated to-be-predicted waters to obtain the real-time total survival of the test fish, the real-time abnormal total number of the test fish and the real-time total number of reproduction individuals of the test fish in each of the plurality of simulated to-be-predicted waters;

obtaining the initial total survival of the test fish in each of the plurality of simulated to-be-predicted waters;

comparing the initial total survival of the test fish with the real-time total survival of the test fish;

calculating, in response to the real-time total survival of the test fish being smaller than or equal to the initial total survival of the test fish, a fish death number of the test fish in each of the plurality of simulated to-be-predicted waters by subtracting the real-time total survival of the test fish from the initial total survival of the test fish;

calculating, in response to the real-time total survival of the test fish being greater than the initial total survival of the test fish, the fish death number of the test fish in each of the plurality of simulated to-be-predicted waters by adding the initial total survival of the test fish to the real-time total number of reproduction individuals of the test fish and subtracting the real-time total survival of the test fish; and calculating the fish abnormal value of the test fish in each of the plurality of simulated to-be-predicted waters based on the real-time abnormal total number of the test fish and the fish death number of the test fish;

step S400, determining, by the water quality determination unit, water quality of each of the plurality of simulated to-be-predicted waters to obtain an actual water quality level of each of the plurality of simulated to-be-predicted waters, and sending, by the water quality determination unit, the actual water quality level of each of the plurality of simulated to-be-predicted waters to a data comparison unit;

wherein a work process of the water quality determination unit comprises:

obtaining the variation value of water pollution of each of the plurality of simulated to-be-predicted waters;

obtaining the fish abnormal value of the test fish in each of the plurality of simulated to-be-predicted waters;

calculating a water quality determination value of each of the plurality of simulated to-be-predicted waters based on the variation value of water pollution and the fish abnormal value of the test fish; and comparing the water quality determination value of each of the plurality of simulated to-be-predicted waters with a water quality determination threshold to determine the actual water quality level of each of the plurality of simulated to-be-predicted waters;

step S500, introducing the variation value of water pollution of each of the plurality of simulated to-be-predicted waters and the fish abnormal value of the test fish in each of the plurality of simulated to-be-predicted waters into a water quality prediction model to obtain a predicted water quality level of each of the plurality of simulated to-be-predicted waters, and sending the predicted water quality level of each of the plurality of simulated to-be-predicted waters to the data comparison unit; and wherein a data comparison process of the data comparison unit comprises:

obtaining the predicted water quality level of each of the plurality of simulated to-be-predicted waters output by the water quality prediction model;

obtaining the actual water quality level of each of the plurality of simulated to-be-predicted waters calculated by the water quality determination unit;

comparing the actual water quality level of each of the plurality of simulated to-be-predicted waters with the predicted water quality level of the simulated to-be-predicted water;

counting, in response to the actual water quality level being equal to the predicted water quality level, a correctly predicted number once;

obtaining a number of the plurality of simulated to-be-predicted waters, recording the number of the plurality of simulated to-be-predicted waters as a number of waters, and comparing the correctly predicted number with the number of waters to obtain prediction accuracy of the plurality of simulated to-be-predicted waters;

generating, in response to the prediction accuracy being smaller than preset prediction accuracy, a signal indicating false prediction; and generating, in response to the prediction accuracy being greater than or equal to the preset prediction accuracy, a signal indicating correct prediction;

wherein a process for obtaining the water quality prediction model comprises:

obtaining the initial water quality parameters and the real-time water quality parameters in each of the plurality of simulated to-be-predicted waters and the initial fish response parameters and the real-time fish response parameters of the test fish in each of the plurality of simulated to-be-predicted waters;

constructing the water quality prediction model by the model construction unit using a deep learning framework, inputting the initial water quality parameters and the real-time water quality parameters in each of the plurality of simulated to-be-predicted waters and the initial fish response parameters and the real-time fish response parameters of the test fish in each of the plurality of simulated to-be-predicted waters into the water quality prediction model to obtain the predicted water quality level of each of the plurality of simulated to-be-predicted waters, and outputting the predicted water quality level of each of the plurality of simulated to-be-predicted waters by the water quality prediction model; and performing learning and training on the water quality prediction model, and outputting the predicted water quality level of each of the plurality of simulated to-be-predicted waters to the data comparison unit; and step S600, comparing the actual water quality level of each of the plurality of simulated to-be-predicted waters with the predicted water quality level of each of the plurality of simulated to-be-predicted waters to generate the signal indicating false prediction or the signal indicating correct prediction.

2. The prediction method as claimed in claim 1, wherein the larger the variation value of water pollution, the more severely impact of the test fish on the plurality of simulated to-be-predicted waters.

3. The prediction method as claimed in claim 1, wherein the larger the fish abnormal value, the more severely impact of the plurality of simulated to-be-predicted waters on the test fish.

* * * * *